United States Patent
Gao et al.

(10) Patent No.: US 10,883,817 B2
(45) Date of Patent: Jan. 5, 2021

(54) METHOD FOR FULL-FIELD MEASUREMENT USING DYNAMIC LASER DOPPLER IMAGING

(71) Applicant: Beijing Jiaotong University, Beijing (CN)

(72) Inventors: Zhan Gao, Beijing (CN); Jie Qin, Beijing (CN); Qibo Feng, Beijing (CN); Shengjia Wang, Beijing (CN); Xu Wang, Beijing (CN); Shanwei Yang, Beijing (CN); Chenjia Gao, Beijing (CN)

(73) Assignee: Beijing Jiaotong University, Beijing (CN)

( * ) Notice: Subject to any disclaimer, the term of this patent is extended or adjusted under 35 U.S.C. 154(b) by 29 days.

(21) Appl. No.: 16/324,181

(22) PCT Filed: Oct. 19, 2016

(86) PCT No.: PCT/CN2016/102567
§ 371 (c)(1),
(2) Date: Feb. 8, 2019

(87) PCT Pub. No.: WO2018/072143
PCT Pub. Date: Apr. 26, 2018

(65) Prior Publication Data
US 2020/0182603 A1 Jun. 11, 2020

(51) Int. Cl.
*G01B 9/02* (2006.01)
*H01S 3/10* (2006.01)

(52) U.S. Cl.
CPC ...... *G01B 9/02045* (2013.01); *H01S 3/10053* (2013.01)

(58) Field of Classification Search
CPC ............ G01B 9/02045; G01B 9/02002; G01B 9/02003; G01B 9/0201; G01B 9/02011; G01B 9/02043
See application file for complete search history.

(56) References Cited

U.S. PATENT DOCUMENTS

| 4,630,051 A | 12/1986 | Adams et al. |
| 9,330,092 B2 * | 5/2016 | Vakoc ................ G01B 9/02028 |

(Continued)

*Primary Examiner* — Jonathan M Hansen
(74) *Attorney, Agent, or Firm* — Hammer & Associates, P.C.

(57) ABSTRACT

A method for full-field measurement using Doppler imaging, comprising the following steps: turning on a laser and adjusting the laser; adjusting a spatial filter to obtain circular laser spots having uniform intensity distribution; adjusting a quarter-wave plate and a whole polarizer in a system, and requiring two beams in a reference object and a measured object having different frequencies and perpendicular polarization directions; applying slight pressure to the measured object, setting a charge coupled device (CCD) camera into a continuous acquisition mode, observing interference fringes, and adjusting a light path so that the fringes are clear and visible; setting the sampling frequency, sampling time, captured image format and resolution size of the CCD camera; turning on a lithium niobate crystal drive power switch to produce a heterodyne carrier frequency; applying continuous equal pushing force to the measured object by means of piezoelectric ceramics (PZT) so as to make the measured object produce continuous bending deformation; controlling the CCD camera to sample using a computer, and collecting a set of time series light interference images along with the continuous deformation of the measured object; and processing the time series light intensity interference image to obtain a three-dimensional data module comprising continuous deformation of the measured objects distributed in time and space.

4 Claims, 1 Drawing Sheet

(56) References Cited

U.S. PATENT DOCUMENTS 9,375,158 B2 * 6/2016 Vakoc ................ A61B 5/0073
2010/0141956 A1 * 6/2010 Leitgeb .............. G01N 21/4795
356/484

* cited by examiner

METHOD FOR FULL-FIELD MEASUREMENT USING DYNAMIC LASER DOPPLER IMAGING

FIELD OF THE INVENTION

The present invention relates to a method for measuring a full-field by dynamic laser Doppler imaging, which belongs to the technical field of optical laser measurement.

PRIOR ART

It is a laser that makes a Doppler effect in acoustics develop into the field of optics. The laser Doppler effect is an effective method for deformation measurement. However, due to the restriction of the detector response frequency, the system can't directly measure the optical signal. Thus, the optical frequency difference technique must be applied to extract the deformation information from the low frequency interference signal. Combining optical Doppler effect with optical heterodyne interferometry, the so-called laser Doppler technology in the existing technology is formed.

Laser Doppler technology has been proved to be a very useful technology. It has many advantages such as non-contact, high accuracy, wide measuring range, anti-electromagnetic interference, fast dynamic response, insensitivity to lateral vibration, and suitable for any object to be tested.

In optical heterodyne technology, the introduction of the heterodyne carrier frequency is a key step. Usually, the heterodyne carrier frequency is shown as a beat signal formed by the interference of two light beams with a small frequency difference. This small frequency difference is usually achieved by using frequency shifter to load different frequency shifts on each beam or by directly using a dual-frequency laser. In the process of measurement, the information, such as the surface deformation of the measured object, is loaded on the carrier frequency, which is regarded as a signal modulation process.

In order to realize the full field measurement in real time, a detector array is certainly necessary. However, the heterodyne carrier frequency introduced by dual frequency laser, acousto-optic modulator and magneto-optical effect are in the range of several MHz to tens of MHz, which are too high for the frame rate of the detector array devices in current time, hence, only point measuring rather than full field measuring in real time can be realized by those methods. On the other hand, the carrier frequency introduced by these methods are hard to be adjusted anymore once these devices are made of, which limits the application scope. The carrier frequency introduced by the mechanical heterodyne carrier device can be flexibly adjusted in the low frequency region, but it is unstable due to the vibration of the drive motor, in addition, the frequency difference produced by this method is small due to the limitation of the rotating speed of the motor.

SUMMARY OF THE INVENTION

The object of the invention is to provide a method for full-field measurement using laser Doppler imaging, which combines time sequence interferometry and laser Doppler technology to realize the real-time and full field heterodyne imaging measurement of the detected object and simplifies the detection system, solving the problem that only the point measurement of laser Doppler technology can be realized at present. It is helpful to improve the measurement accuracy and range, and then the accurate real-time and full-field measurement can be carried out. It also has a strong ability to avoid disturbance and a wide application range.

Thus, there is provided a method for measuring a full-field by taking advantage of dynamic laser Doppler imaging, which is characterized by the following steps:

Step 1: Turn on the laser for 15 minutes and adjust the laser to make the emitted laser beam's level perpendicular to the emitted surface of the laser. The optical components will be placed as shown in FIG. 1. After passing through a polarizer, a lithium niobate crystal controlled by the driving power source and a quarter-wave plate, the laser beam will be expanded by the spatial filter and divided into two beams of light by a beam splitter. One beam of light irradiates on the reference material through a polarizer and the other beam irradiates on the object also through a polarizer. Next, the reference light and the object light are transmitted and reflected by a beam splitter respectively and then transmit through a polarizing beam later, making the reference light and the object light are interfered, and the interferograms are collected by the CCD camera through an imaging system. It is required that the center of every part of the device is coaxial at the same height and the surface of the reference object and the measured object are perpendicular to the direction of the incident light.

Step 2: Adjust the spatial filter to obtain a circular laser spot with the uniform intensity distribution. The spot size needs to cover the detected surface, so as to achieve the full field surface detection.

Step 3: Adjust the quarter-wave plate and all the polarizers in the system as is shown in FIG. 1, requiring that the two beams of the reference object and the measured object have different frequencies and the polarization's directions are vertical. The angle of the polarizer in front of the CCD camera is 45• so that two perpendicular polarized light transmitted through this polarizer can be interfered.

Step 4: Put a slight pressure on the measured object and the CCD camera is set as the continuous acquisition mode. Then observe the interference fringes in the computer through the real-time subtraction algorithm, and adjust the optical path to make the interference fringes clearly visible.

Step 5: Set the sampling frequency, sampling time, image format and resolution of CCD camera according to the system parameters.

Step 6: Turn on the power switch to drive the lithium niobate crystal, generating the heterodyne carrier frequency.

Step 7: The piezoelectric ceramics (PZT) are used to provide a continuous equivalent thrust on the measured object, which makes the measured object get a continuous bending deformation.

Step 8: Sample the interferograms by using CCD camera controlled by the computer. With the continuous deformation of the object, a group of time series light intensity interferograms are collected. The time series light intensity interferograms are processed with the designed algorithm by the computer, thus obtaining the three-dimensional data module which includes the time and spatial distribution of the continuous deformation of the measured object.

The invention combines the advantages of time series interferometry and laser Doppler technology, solving the problem that only a point's deformation can be measured by the laser Doppler technology at present and realizing the real-time heterodyne imaging full field measurement of the measured object. The invention simplifies the detection system and greatly improves the accuracy and range of measurement. It has the characteristics of real-time, full field and accurate measurement, and the properties of strong anti-interference and wide application range.

According to the invention, the width of heterodyne frequency shift, such as Doppler shift, carries the information of measured physical quantities. Through the conventional phase extraction methods, such as spectrum analysis, Fourier transform and Wavelet transform, the phase information can be obtained, so as to obtain the measured physical quantities. Since the frequency shift between the two beams is introduced by the invention, even if the beat frequency has a slow drift, the relative phase of the beat frequency can still be accurately measured. In the heterodyne system, it is very important to obtain a stable and reliable heterodyne carrier frequency, which is directly related to the stability and measurement accuracy of the system.

According to the present invention, the new technology of Doppler imaging full-field measurement is based on the double transverse electro-optic effect. There is no moving mechanical part in the system. The carrier frequency of the system can be adjusted and the value of the heterodyne carrier frequency depends on the rotational angular frequency of the driving electric field. Because the value of the carrier frequency is only related to the frequency of the supply signal which drives the power, the carrier frequency can be obtained from the order of Hz to the order of GHz so that the carrier frequency can be widely adjusted. By setting the appropriate electric field frequencies, the generated carrier frequencies can be well adapted to various detectors' sampling frequencies. From low frequency to high frequency, it can meet the requirements of the different measured objects under the different conditions. With this heterodyne carrier frequency technology, the dynamic full-field imaging is possible.

According to the present invention, dynamic full-field imaging is realized, and the full-field imaging technology based on the time series is implemented by combining the heterodyne carrier frequency device with the double transverse electro-optic effects. Using the detector of the surface array to collect the full field interference signal of the time series, the signal data are transmitted to the computer. Next Fourier transform or Wavelet transform the light intensity of each point on the time axis, so that the truncated phase can be obtained. Then the phase unwrapping process will be carried out by the unwrapping technique, so that every point on the measured object changes with time. Finally, the phase information can be calculated so that the full field surface deformation of the measured object based on time series are also calculated, which can provide a powerful means for non-destructive optical inspection and other technologies.

The existing Doppler (heterodyne) detections are all one-point detections, but the present invention can realize the real-time surface detection.

BEST MODES FOR CARRYING OUT THE INVENTION

Figure 1:
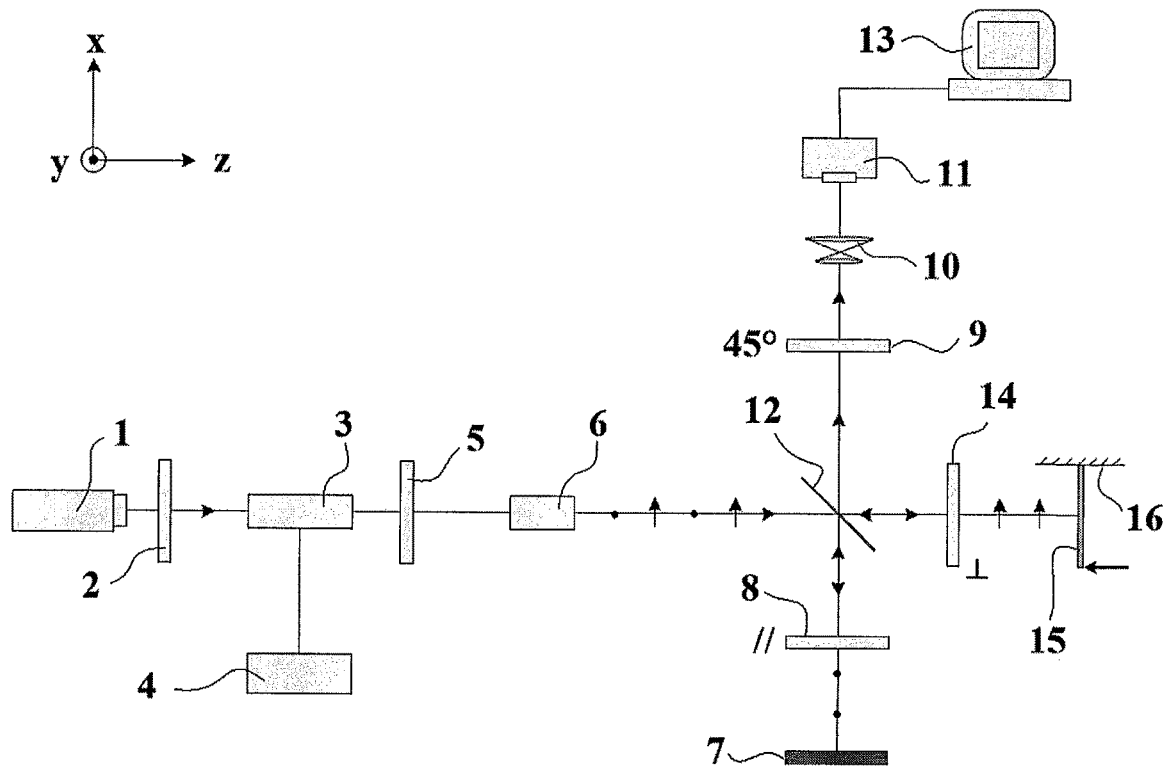
FIG. 1 is the optical path for full-field measurement of laser Doppler imaging according to the present invention.
Figure 2:
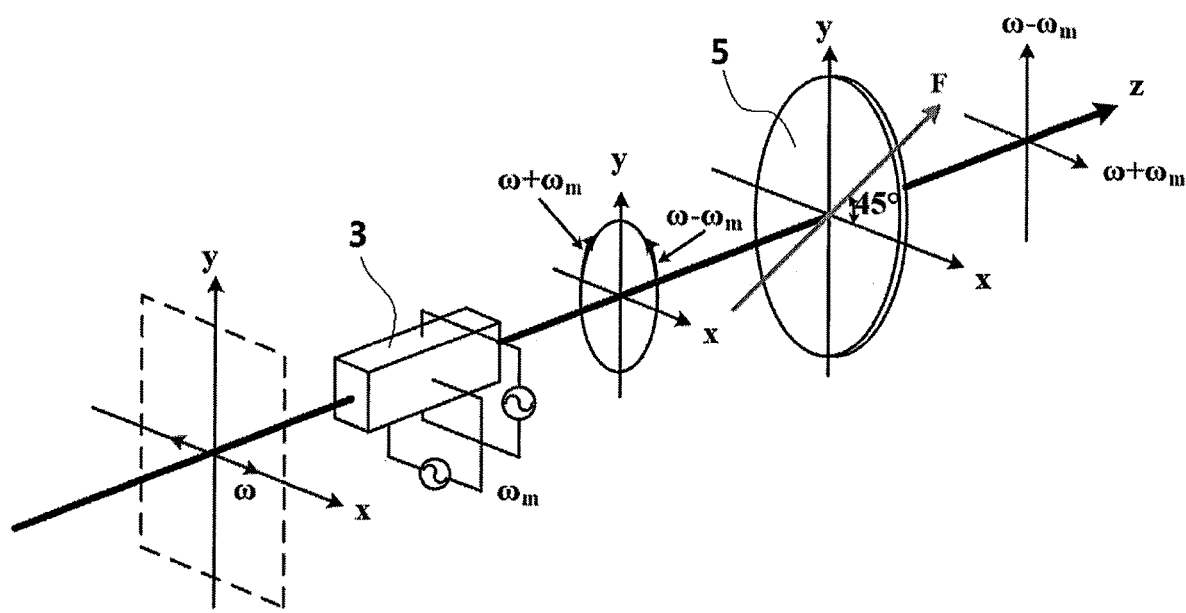
FIG. 2 is the configuration of the dual transverse electro-optic modulator according to the present invention.

The following is a detailed description of the embodiment using the principle of the laser Doppler imaging full-field measurement as shown in FIGS. 1 and 2. It should be emphasized that the following description is just for an example and not intended to limit the scope and application of the present invention.

As shown in FIG. 1, the reference number 1 represents by laser diodes; the reference number 2 8, 9 and 14 represent the polarizers; the reference number 3 represents the lithium niobate crystal (LiNbO$_3$); the reference number 4 represents the driving power of the lithium niobate crystal; the reference number 5 represents the quarter-wave plate; the reference number 6 represents the spatial filter; the reference number 7 represents the reference object; the reference number 10 represents the imaging system; the reference number 11 represents the CCD camera; the reference number 12 represents the beam splitter; the reference number 13 represents the computer; the reference number 15 represents the piezoceramic; the reference number 16 represents the cantilever.

As shown in FIG. 2, the reference number 3 represents the lithium niobate (LiNbO$_3$) crystal, and the reference number 5 represents a quarter-wave plate.

Open the laser for 15 minutes and adjust the laser so that the emitted laser level is perpendicular to the exit surface of the laser. The optical components are placed as is shown FIG. 1, and the laser light beam passes through the polarizer, becoming the linear polarized light. The light passes through the lithium niobate crystal controlled by the driving power, split into a right-circular polarized light and a left-circularly polarized light. Next, after passing the quarter-wave plates becoming a pair of linearly polarized light whose polarized orientation are perpendicular to each other, the light beam is expanded by a spatial filter. Then the beam is divided into two beams by the beam splitter. One of them passes through a vertical polarization direction polarizer, which forms a vertical polarization direction light, irradiating on the reference object. The other beam passes through a horizontal polarization direction polarizer, which forms a horizontal in surface polarization direction light, irradiating on the measured object. The reference light and the object light are transmitted and reflected through the beam splitter respectively, and then pass a polarizer whose polarization direction is mutually 45° to the both two prior polarizers' polarization direction. The amplitude of the reference light and the object light perpendicular to the polarization direction is projected to the 45° angle so that the same vibration components are generated which satisfy the interference conditions, and the interference is generated, whose interferograms are collected by the CCD camera through the imaging system.

(1) The Introduction of Heterodyne

FIG. 2 shows the structure of a dual transverse electro-optic modulator which consists of a dual transverse electric field, a lithium niobate crystal and a quarter-wave plate. The two electric fields are alternating sinusoidal electric fields and the phase delay between the two electric fields is $\pi/2$. Due to the uniform rotation of the synthetic electric field's vector in the modulation process and the whole device is axisymmetric, thus, there is no need to guarantee the fast axis direction of the quarter-wave plate during the installation and commissioning process.

Suppose that the matrix of the process that incident light passes through the polarizer becoming the linearly polarized light from is expressed as $$V_{input} = \begin{bmatrix} 1 \\ 0 \end{bmatrix} e^{-i\omega t} \tag{1}$$

where ω is the frequency of the incident light. When the lithium niobate crystal is placed in a double transverse sinusoidal electric field, it can be regarded as a rolling wave plate, and we can accurately know the rotation speed and phase delay of this equivalent wave plate. Therefore, the effect of lithium niobate crystal on incident light can be described by this equivalent rolling wave plate, whose Jones matrix is expressed as $$T_{NWP} = \begin{bmatrix} \cos\frac{\Gamma}{2} + i\sin\frac{\Gamma}{2}\cos\omega_m t & i\sin\frac{\Gamma}{2}\sin\omega_m t \\ i\sin\frac{\Gamma}{2}\sin\omega_m t & \cos\frac{\Gamma}{2} - i\sin\frac{\Gamma}{2}\cos\omega_m t \end{bmatrix} \quad (2)$$

Where $\omega_m$ is the angular frequency of the rotating electric field. Therefore, when the incident linearly polarized light passes through the crystal along its three-fold axis, the matrix of the emergent light passing through the lithium niobate crystal is expressed as $$V' = T_{NWP} \cdot V_{input} = \quad (3)$$

$$\cos\frac{\Gamma}{2}\begin{bmatrix}1\\0\end{bmatrix}e^{-i\omega t} + \frac{i\sin\frac{\Gamma}{2}}{2}\left(\begin{bmatrix}1\\i\end{bmatrix}e^{-i(\omega+\omega_m)t} + \begin{bmatrix}1\\-i\end{bmatrix}e^{-i(\omega-\omega_m)t}\right)$$

Through the formula (3), we know that the first item in the formula represents a linearly polarized light, whose polarization direction is consistent with the polarization direction of the incident light; the second item in the formula represents a right-circularly polarized light whose frequency shift is $\omega_m$ due to the effect of lithium niobate crystal; the third item in the formula represents a levo circularly polarized light with a frequency shift of $-\omega_m$. After that, the emergent light of the lithium niobate crystal passes through a quarter-wave plate. The angle between the optical axis of quarter-wave plate and the y axis is 45°. The quarter-wave plate can be expressed as a Jones matrix:

$$T_{QWP} = \frac{1}{\sqrt{2}}\begin{bmatrix} 1 & -i \\ -i & 1 \end{bmatrix} \quad (4)$$

Finally, the light represented by formula (3) passes through the quarter-wave plate, and the emergent light can be expressed as $$V'' = T_{QWP} \cdot V' = \quad (5)$$

$$\frac{\cos\frac{\Gamma}{2}}{\sqrt{2}}\begin{bmatrix}1\\-i\end{bmatrix}e^{-i\omega t} + \frac{\sin\frac{\Gamma}{2}}{\sqrt{2}}\left(i\begin{bmatrix}1\\0\end{bmatrix}e^{-i(\omega+\omega_m)t} + \begin{bmatrix}0\\1\end{bmatrix}e^{-i(\omega-\omega_m)t}\right)$$

From the formula (5), we can see that the first item in the formula is a left-circularly polarized light whose frequency is as same as the incident light frequency. The second and third items in the formula are a pair of linearly polarized light whose polarization directions are perpendicular and the frequency difference between these linearly polarized lights is 2ωm.

When light passes through the frequency shifter, a pair of linearly polarized light with perpendicular polarization directions and a frequency difference can be obtained. The first item in formula (5) is considered as the background light. By setting the voltage of the two electric fields to the crystal's half-wave voltage, the first item can be zero. In other words, the background light can be eliminated and the signal-to-noise ratio can be improved by changing the voltage.

(2) Structure Description of Laser Doppler Imaging Full-Field Measurement System When the light passes through the frequency shifter, the emergent light is put into the Michelson interferometer (as shown in FIG. 1). The frequency-shifted light is equally divided into two beams by a beam splitter (BS). One of them is incident into the reference arm, which is irradiated on the reference mirror. The other is incident into the measuring arm, which is irradiated on the surface of the measured object. As is shown in FIG. 1, two polarizers are placed in front of the reference mirror and the measured object respectively, and the polarization directions are perpendicular to each other, in order to separate the two linearly polarized lights.

Another polarizer is placed in front of the detector. The polarization direction is 45° from the previous two polarizers. The purpose is to project the reference light and measuring light whose polarization directions are perpendicular, into the direction of the 45° with the equal amplitude of the polarized lights, so that the same vibration component is generated, meeting the conditions of interference and then interfered with each other. The interferometric intensity fields are sampled continuously by the detector in time series.

(3) Signal Processing Algorithm

In a laser Doppler imaging system, the object light has a time domain modulated signal of the surface of the object being measured, which is collected by the detector along with the reference light. Usually, heterodyne interference intensity field based on the time series is collected by the detector and can be expressed as:

$$I(t) = I_0 + I_c \cos(\Phi_0 + 2\omega_m t) \quad (6)$$

where $I_0$ represents the synthesis of all light intensities unrelated to the carrier frequency term; $I_c$ is the amplitude of the heterodyne carrier frequency signal; $\Phi_0$ is the initial phase difference of the two beams that generate carrier light, which can be ignored in the calculation; $2\omega_m t$ is the heterodyne carrier frequency.

When the surface to be tested is deformed, the optical path difference between the reference and the measured object changes. The time domain heterodyne intensity function is recorded as the surface to be measured is deformed. The instantaneous deformation distribution of the surface to be tested is expressed as $\Delta z(x,y,t)$, so that the phase change distribution caused by the deformation can be expressed as:

$$\varphi(x,y,t) = 4\pi\Delta z(x,y,t)/\lambda \quad (7)$$

where λ is the wavelength of the incident light. Then the time domain heterodyne interference intensity function including the surface deformation distribution to be measured can be expressed as:

$$I(x,y,t) = I_0 + \cos[\Phi_0 + 2\pi f_0 t + \varphi(x,y,t)] \quad (8)$$

where $f_0$ is the heterodyne carrier frequency, the magnitude of which is equal to twice the rotational frequency of the driving electric field, expressed as $f_0 = \omega_m/\pi$. After formula (8) is developed using Euler's formula:

$$I(x,y,t) = I_0 + c(x,y,t)\cdot\exp(j2\pi f_0 t) + c^*(x,y,t)\cdot\exp(-j2\pi f_0 t) \quad (9)$$

symbol * indicates complex conjugate, c can be expressed as:

$$c(x,y,t)=\tfrac{1}{2}I_c \cdot \exp[j\Phi(x,y,t)] \qquad (10)$$

where $\Phi(x,y,t)$ represents the phase part of the cosine function of equation (10), and the specific form is $$\Phi(x,y,t)=\Phi_0+2\pi f_0 t+\varphi(x,y,t) \qquad (11)$$

In order to calculate the phase $\Phi(x,y,t)$, the equation (9) is converted to the frequency domain using the Fourier transform, and the result is $$F(I)=A+C(f_0,\Delta z/\lambda t)+C^*(-f_0,\Delta z/\lambda t) \qquad (12)$$

where F(I) is the spectral distribution of light intensity distribution (9); A is the spectrum of the intensity of the DC component of the intensity change, occupying the zero frequency position in the spectral line; C and C* are conjugated to each other, and represent the spectral components of the second and third terms of Equation (9), respectively; $f_0$ represents the position in the spectrum of the carrier frequency; $\Delta z/\lambda t$ represents the spread spectrum of the carrier frequency affected by the deformation rate of the surface to be tested. It is worth noting that in this spectrum, the spread of the heterodyne carrier frequency carries the surface deformation information. Obviously, the three terms in equation (12) occupy different frequency ranges in the spectrum. Therefore, spectral filtering can be performed on the Fourier transform spectrum to isolate the required $C(f_0, \Delta z/\lambda t)$ term without frequency mixing. Using the inverse Fourier transform, the c represented by equation (10) can be restored. The phase information obtained can be calculated by the following formula:

$$\log[F^{-1}(C(x,y,t))]=\log[(\tfrac{1}{2})I_c]+i\Phi P(x,y,t) \qquad (13)$$

where $F^{-1}$ represents the inverse Fourier transform function; the imaginary part $\Phi(x,y,t)$ is the phase to be sought in the cosine function of equation (8). So far, the truncated phase is obtained, and then the phase unwrapping technique is applied to obtain the continuous phase. It can be known from equation (11) that the phase obtained at this stage is not only a phase change component caused by surface deformation, but also contains carrier frequency information, so it is necessary to remove the carrier frequency. Since the rotational frequency of the driving electric field is specified during the introduction of the carrier frequency, in other words, the magnitude of the heterodyne carrier frequency is controlled by adjusting the driving frequency of the driving electric field. Therefore, the phase shift $2\pi f_0 t$ generated by the heterodyne carrier frequency during this detection time can be directly obtained. In equation (11), the phase change caused by the carrier frequency is subtracted, and the phase change distribution caused by the deformation of the surface to be tested is obtained. Finally, according to the equation (7) and the wavelength in the system, the instantaneous shape distribution can be obtained. The same processing is performed for each point of the whole field, not $\Delta z(x,y,t)$ only the spatial distribution of the surface shape variables to be tested is obtained, but also the time distribution of the surface type variables to be tested can be obtained by using the time series algorithm. Thereby the function of dynamic Doppler imaging full field measurement is realized.

The above is only a preferred embodiment of the present invention, but the scope of protection of the present invention is not limited to this. Any changes or substitutions that can be easily conceived by those skilled in the art depending on the disclosure of the present invention should be covered by the scope of the present invention. Therefore, the scope of protection of the invention should be determined by the scope of the appended claims.

The invention claimed is:

1. A method for Doppler imaging a full field to perform a measurement, characterized in that in a heterodyne system, a heterodyne frequency shift between two beams is performed, and the frequency shift is flexibly adjustable according to measurement requirements; a change of a measured physical quantity affects a phase value, and the phase value is extracted by the mathematical means of Fourier transform or wavelet transform, and then the measured physical quantity is deduced, used for a laser which includes a polarization controller, a spatial filter, a general beam splitter, a polarizer, a telecentric imaging system and a plane mirror, wherein said method includes the following steps:

1) turning on the laser and adjusting the laser to make an emitted laser beam's level perpendicular to the emitted surface of the laser; after passing through the polarizer, a lithium niobate crystal controlled by a driving power source and a quarter-wave plate, the laser beam is expanded by a spatial filter and divided into two beams of light by the beam splitter; one of the two beams of light irradiates on the reference material through a polarizer, and the other beam irradiates on the object also through another polarizer; next, a reference light and an object light are transmitted and reflected by another beam splitter respectively, and then transmitted through a polarizing beam later, making the reference light and the object light interfered, and an interferogram is collected by a CCD camera through an imaging system; a center of every part of the device is coaxial at the same height, and surface of a reference object and a measured object are perpendicular to the direction of the incident light;

2) adjusting the spatial filter to obtain a circular laser spot with a uniform intensity distribution, in which a spot size needs to cover a surface to be detected, so as to achieve a full field surface detection;

3) adjusting the quarter-wave plate and all the polarizers in the laser system, so that the two beams of the reference object and the measured object have different frequencies and their polarization's directions are perpendicular to each other, an orientation of the polarizer in front of the CCD camera is set at 45°, so that two perpendicular polarized lights transmitted through this polarizer are interfered;

4) putting a slight pressure on the measured object and setting the CCD camera in a continuous acquisition mode so as to observe interference fringes, and adjust an optical path to make the interference fringes clearly visible;

5) setting a sampling frequency, a sampling time, an image format and a resolution of the CCD camera;

6) turning on a power switch to drive a lithium niobate crystal to generate a heterodyne carrier frequency;

7) providing a continuous equivalent thrust on the measured object by means of a piezoelectric ceramics to make the measured object get a continuous bending deformation; and 8) controlling the CCD camera by a computer for sampling, and collecting a group of time series light intensity interferograms with the continuous deformation of the object; processing the time series light intensity interferograms, thus obtaining a three-dimensional data module which includes the time and spatial distribution of the continuous deformation of the measured object.

2. The method as claimed in claim 1, characterized in that the laser has a linearly polarized light of an outputting frequency $\omega$.

3. The method as claimed in claim 1, characterized in that the polarization controller is a lithium niobate polarization controller.

4. The method as claimed in claim 1, characterized in that the laser is warmed up for 15 minutes.

\* \* \* \* \*